(12) United States Patent
Chakraborty

(10) Patent No.: US 8,178,888 B2
(45) Date of Patent: May 15, 2012

(54) SEMICONDUCTOR LIGHT EMITTING DEVICES WITH HIGH COLOR RENDERING

(75) Inventor: Arpan Chakraborty, Goleta, CA (US)

(73) Assignee: Cree, Inc., Durham, NC (US)

( * ) Notice: Subject to any disclaimer, the term of this patent is extended or adjusted under 35 U.S.C. 154(b) by 849 days.

(21) Appl. No.: 12/024,400

(22) Filed: Feb. 1, 2008

(65) Prior Publication Data

US 2009/0194775 A1    Aug. 6, 2009

(51) Int. Cl.
*H01L 33/00* (2010.01)
*H01L 21/00* (2006.01)

(52) U.S. Cl. ............... 257/98; 257/79; 257/95; 257/99; 257/100; 257/E33.061; 257/E33.068; 257/E33.074; 438/22; 438/25; 438/27; 438/29; 428/690

(58) Field of Classification Search ............ 257/79, 257/95, 98, 99, 100, E33.061, E33.068, E33.074; 438/22, 25, 27, 29; 428/690
See application file for complete search history.

(56) References Cited

U.S. PATENT DOCUMENTS

| | | |
|---|---|---|
| 4,918,497 A | 4/1990 | Edmond |
| 4,966,862 A | 10/1990 | Edmond |
| 5,027,168 A | 6/1991 | Edmond |
| 5,210,051 A | 5/1993 | Carter, Jr. |
| 5,338,944 A | 8/1994 | Edmond et al. |
| 5,393,993 A | 2/1995 | Edmond et al. |
| 5,416,342 A | 5/1995 | Edmond et al. |
| 5,523,589 A | 6/1996 | Edmond et al. |
| 5,604,135 A | 2/1997 | Edmond et al. |
| 5,631,190 A | 5/1997 | Negley |
| 5,739,554 A | 4/1998 | Edmond et al. |
| 5,912,477 A | 6/1999 | Negley |
| 6,120,600 A | 9/2000 | Edmond et al. |
| 6,187,606 B1 | 2/2001 | Edmond et al. |
| 6,201,262 B1 | 3/2001 | Edmond et al. |
| 6,958,497 B2 | 10/2005 | Emerson et al. |
| 2002/0123164 A1 | 9/2002 | Slater, Jr. et al. |
| 2003/0006418 A1 | 1/2003 | Emerson et al. |
| 2004/0056260 A1 | 3/2004 | Slater, Jr. et al. |
| 2004/0094757 A1 | 5/2004 | Braune et al. |
| 2005/0161690 A1 | 7/2005 | Lai et al. |

(Continued)

FOREIGN PATENT DOCUMENTS

DE    199 52 932 C1    5/2001

(Continued)

OTHER PUBLICATIONS

Invitation to Pay Additional Fees and, Where Applicable, Protest Fee (7 pages) corresponding to International Application No. PCT/US2008/013260; Mailing Date: Mar. 24, 2009.

(Continued)

*Primary Examiner* — Dao H Nguyen
(74) *Attorney, Agent, or Firm* — Myers Bigel Sibley & Sajovec

(57) ABSTRACT

A packaged light emitting device (LED) includes a light emitting diode configured to emit primary light having a peak wavelength that is less than about 465 nm and having a shoulder emission component at a wavelength that is greater than the peak wavelength, and a wavelength conversion material configured to receive the primary light emitted by the light emitting diode and to responsively emit light having a color point with a ccx greater than about 0.4 and a ccy less than about 0.6.

22 Claims, 8 Drawing Sheets

U.S. PATENT DOCUMENTS

| | | | |
|---|---|---|---|
| 2005/0199897 A1* | 9/2005 | Setlur et al. | 257/98 |
| 2006/0243987 A1 | 11/2006 | Lai | |
| 2007/0108888 A1 | 5/2007 | Chen et al. | |
| 2007/0212802 A1* | 9/2007 | Lee et al. | 438/22 |
| 2007/0262339 A1 | 11/2007 | Hussell et al. | |
| 2008/0135862 A1* | 6/2008 | Maeda et al. | 257/98 |
| 2008/0180948 A1* | 7/2008 | Yoon et al. | 362/230 |
| 2010/0109991 A1* | 5/2010 | Miyachi | 345/87 |

FOREIGN PATENT DOCUMENTS

| | | |
|---|---|---|
| EP | 1 764 840 A1 | 3/2007 |
| EP | 1 854 863 A1 | 11/2007 |

OTHER PUBLICATIONS

Internatioanl Search Report and Written Opinion (18 pages) corresponding to International Application No. PCT/US2008/013260; Mailing Date: Jul. 28, 2009.

Luminesence Properties of a Red Phosphor, $CaAlSiN_3:Eu^{2}+$, for White Light Emitting Diodes, The Electrochemical Society; 9:4, pp. H22-H25 (2006).

High-efficiency soft and warm white LEDs, Cree,Inc., pp. 1-9, Feb. 21, 2007.

* cited by examiner

SEMICONDUCTOR LIGHT EMITTING DEVICES WITH HIGH COLOR RENDERING

STATEMENT OF U.S. GOVERNMENT INTEREST

This invention was made with Government support under Contract No. 05-2-5507 awarded by the United States Air Force. The Government has certain rights in the invention.

BACKGROUND

This invention relates to semiconductor light emitting devices and methods of fabricating semiconductor light emitting devices, and more particularly to packages and packaging methods for semiconductor light emitting devices.

Light emitting diodes and laser diodes are well known solid state electronic devices capable of generating light upon application of a sufficient voltage. Light emitting diodes and laser diodes may be generally referred to as light emitting devices ("LEDs"). Light emitting devices generally include a p-n junction formed in an epitaxial layer grown on a substrate such as sapphire, silicon, silicon carbide, gallium nitride, aluminum indium gallium nitride, gallium arsenide, aluminum indium gallium arsenide, aluminum indium gallium phosphide, and the like. The wavelength distribution of the light generated by the LED generally depends on the material from which the p-n junction is fabricated and the structure of the thin epitaxial layers that make up the active region of the device.

Typically, an LED chip includes a substrate, an n-type epitaxial region formed on the substrate and a p-type epitaxial region formed on the n-type epitaxial region (or vice-versa). In order to facilitate the application of a voltage to the device, an anode ohmic contact is formed on a p-type region of the device (typically, an exposed p-type epitaxial layer) and a cathode ohmic contact is formed on an n-type region of the device (such as the substrate or an exposed n-type epitaxial layer).

An LED chip emits optical energy having a relatively narrow bandwidth. Accordingly, light emitted by an LED chip is highly saturated light that appears to have a single color. However, it is desirable in many applications to generate white light using solid state light emitting devices, such as LEDs. White light is a combination of different wavelengths of light.

Light that appears white to an observer can be generated by surrounding a blue LED chip with a wavelength conversion material such as a phosphor. At least some of the light emitted by the LED at a first wavelength (primary light) may be absorbed by the phosphor, which may responsively emit light at a second wavelength (secondary light). The primary light emitted by the LED chip and the secondary light emitted by the phosphor particles may combine to produce light having a plurality of wavelengths, and that may be perceived by an observer as having a different color than either the primary light or the secondary light. For example, if the primary light is blue and the phosphor is selected to generate a yellow light in response to stimulation by the blue primary light, the resulting combination of light emitted by the package may appear white, or nearly white, to an observer. However white light that is generated in such a manner may not be capable of illuminating objects well.

SUMMARY

A packaged light emitting device (LED) according to some embodiments of the invention includes a light emitting diode configured to emit primary light having a peak wavelength that is less than about 465 nm and having a shoulder emission component at a wavelength that is greater than the peak wavelength, and a wavelength conversion material configured to receive the primary light emitted by the light emitting diode and to responsively emit light having a color point with a ccx greater than about 0.4 and a ccy less than about 0.6, wherein (ccx, ccy) refers to the coordinates of the color point on a 1931 CIE diagram. In some embodiments, the wavelength conversion material may include a YAG:Ce with ccx ranging between 0.458 and 0.462 and ccy ranging between 0.525 and 0.527.

The wavelength conversion material may have a D50 particle size of about 11 μm or greater.

The device may further include a second wavelength conversion material configured to receive light emitted by the light emitting diode and to responsively emit light having a dominant wavelength greater than 600 nm. In some embodiments, the second wavelength conversion material may have ccx=0.639 and ccy=0.362. The second wavelength conversion material may include an orange or a red phosphor. In some embodiments, a ratio of a total amount of the first and second wavelength conversion materials by weight can be about 70:30.

The packaged LED may further include a light-scattering lens arranged over the wavelength conversion material and configured to refract light emitted by the LED and the wavelength conversion material, the light scattering lens may be configured to scatter the emitted light randomly. The light-scattering lens may include a transparent lens body including light scattering particles in the lens body. The light-scattering lens may include a roughened outer surface.

The LED may have a peak wavelength that is less than about 460 nm. In particular, the LED may have a peak wavelength of about 450 nm. The LED may have a shoulder emission component at about 470 nm. The LED may have a dominant wavelength less than about 480 nm.

A packaged light emitting device (LED) according to some embodiments includes a light emitting diode configured to emit primary light having a peak wavelength that is less than about 460 nm and having a shoulder emission component at a wavelength that is greater than the peak wavelength, and a wavelength conversion material configured to receive light emitted by the light emitting diode and to responsively emit warm white light having a color point with a ccx between about 0.4 and 0.46 and a ccy between about 0.36 and 0.42.

Some embodiments of the invention provide methods of forming a packaged light emitting device (LED). The methods include mounting a light emitting diode on a submount, the light emitting diode being configured to emit primary light having a peak wavelength that is less than about 460 nm and having a shoulder emission component at a wavelength that is greater than the peak wavelength, and positioning a wavelength conversion material adjacent the light emitting diode. The wavelength conversion material is configured to receive the primary light emitted by the light emitting diode and to responsively emit light having a color point with a ccx greater than about 0.4 and a ccy less than about 0.5.

DETAILED DESCRIPTION OF EMBODIMENTS OF THE INVENTION

Figure 1:
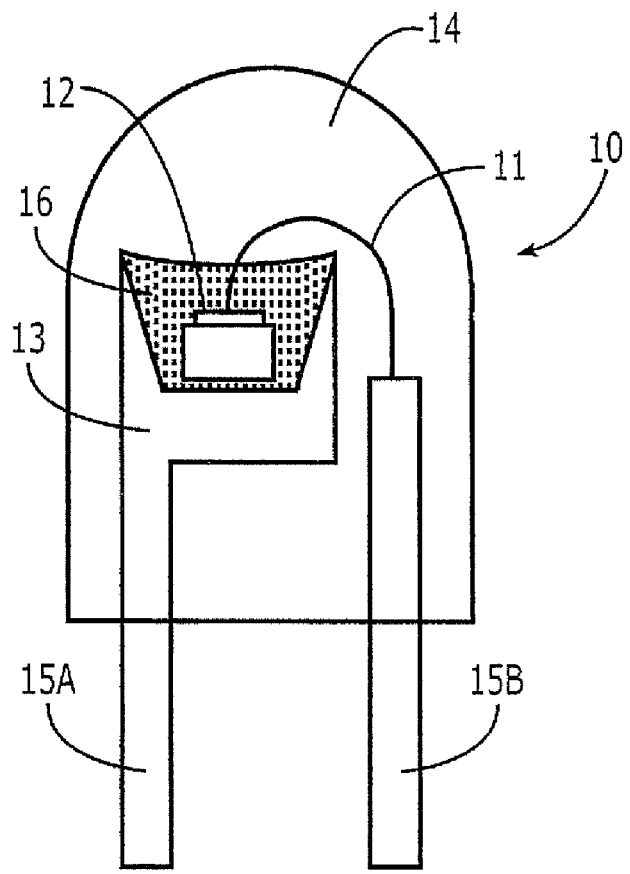
FIGS. 1 and 2 are cross-sectional side views illustrating light emitting device packages according to some embodiments of the invention.

The present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. It will be understood that if part of an element, such as a surface, is referred to as "inner," it is farther from the outside of the device than other parts of the element. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional, perspective, and/or plan view illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Various embodiments of the present invention for packaging a semiconductor light emitting device will be described herein. As used herein, the term semiconductor light emitting device may include a light emitting diode, laser diode and/or other semiconductor device which includes one or more semiconductor layers, which may include silicon, silicon carbide, gallium nitride and/or other semiconductor materials. A light emitting device may or may not include a substrate such as a sapphire, silicon, silicon carbide, gallium nitride, and/or another microelectronic substrates. A light emitting device may include one or more contact layers which may include metal and/or other conductive layers. In some embodiments, ultraviolet, blue and/or green light emitting diodes may be provided. Red and/or amber LEDs may also be provided. The design and fabrication of semiconductor light emitting devices are well known to those having skill in the art and need not be described in detail herein.

For example, the semiconductor light emitting device may be gallium nitride-based LEDs or lasers fabricated on a silicon carbide substrate such as those devices manufactured and sold by Cree, Inc. of Durham, N.C. The present invention may be suitable for use with LEDs and/or lasers as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, the disclosures of which are incorporated herein by reference as if set forth fully herein. Other suitable LEDs and/or lasers are described in published U.S. Patent Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Publication No. US 2002/0123164 A1 entitled Light Emitting Diodes Including Modifications for Light Extraction and Manufacturing Methods Therefor. Furthermore, phosphor coated LEDs, such as those described in U.S. Patent Publication No. 2004/0056260 A1, entitled Phosphor-Coated Light Emitting Diodes Including Tapered Sidewalls and Fabrication Methods Therefor, the disclosure of which is incorporated by reference herein as if set forth fully, may also be suitable for use in embodiments of the present invention. The LEDs and/or lasers may be configured to operate such that light emission occurs through the substrate. In such embodiments, the substrate may be patterned so as to enhance light output of the devices as is described, for example, in the above-cited U.S. Patent Publication No. US 2002/0123164 A1.

In order to use an LED chip in a circuit, it is known to enclose an LED chip in a package to provide environmental and/or mechanical protection, color selection, focusing and the like. An LED package also includes electrical leads, contacts or traces for electrically connecting the LED package to an external circuit. In an LED package 10 as illustrated in FIG. 1, an LED chip 12 is mounted on a reflective cup 13 by means of a solder bond or conductive epoxy. One or more wirebonds 11 connect the ohmic contacts of the LED chip 12 to leads 15A and/or 15B, which may be attached to or integral with the reflective cup 13.

The reflective cup may be filled with an encapsulant material 16 containing a wavelength conversion material such as a phosphor. At least some of the light emitted by the LED at a first wavelength (primary light) may be absorbed by the phosphor, which may responsively emit light at a second wavelength (secondary light). The primary light emitted by the LED chip 12 and the secondary light emitted by the phosphor particles may combine to produce light having a plurality of wavelengths, and that may be perceived by an observer as having a different color than either the primary light or the secondary light. For example, if the primary light is blue and the phosphor is selected to generate a yellow light in response to stimulation by the blue primary light, the resulting combination of light emitted by the package 10 may appear white, or nearly white, to an observer.

For white light conversion, an LED having a peak wavelength between 445 and 470 nm is typically used. Within the specified range, shorter wavelength LEDs (445-455 nm) typically have higher radiative flux. However, the longer wavelength LEDs (~465-475 nm) result in higher color rendering index (CRI) for white light emitting diodes.

The entire assembly may be encapsulated in a clear protective resin 14, which may be molded in the shape of a lens to collimate the light emitted from the LED chip 12 and/or phosphor particles in the encapsulant material 16.

Figure 2:
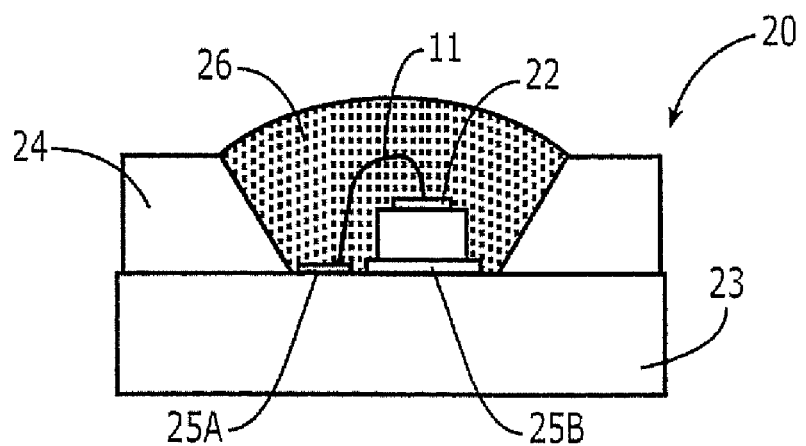

Another LED package 20 is illustrated in FIG. 2. The package of FIG. 2 may be more suited for high power operations which may generate more heat. In the LED package 20, one or more LED chips 22 are mounted onto a carrier such as a printed circuit board (PCB) carrier 23. A metal reflector 24 mounted on the carrier 23 surrounds the LED chip(s) 22 and reflects light emitted by the LED chips 22 away from the package 20. The reflector 24 also provides mechanical protection to the LED chips 22. One or more wirebond connections 11 are made between ohmic contacts on the LED chips 22 and electrical traces 25A, 25B on the carrier 23. The mounted LED chips 22 are then covered with an encapsulant 26, which may provide environmental and mechanical protection to the chips while also acting as a lens. The encapsulant material 26 may further include a phosphor for wavelength conversion. The metal reflector 24 is typically attached to the carrier by means of a solder or epoxy bond.

Figure 3A:
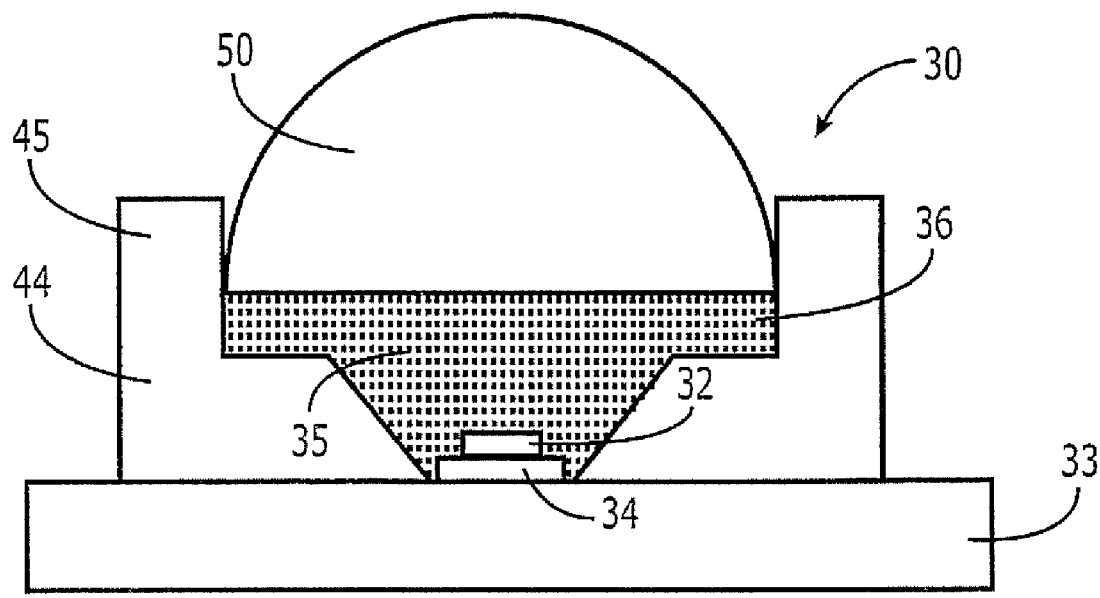
FIGS. 3A and 3B are cross-sectional side views illustrating light emitting device packages according to some embodiments of the invention.
Figure 3B:
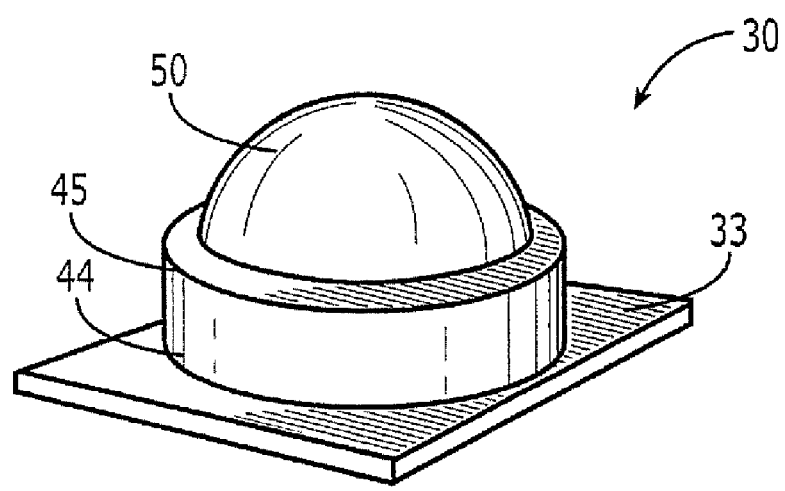

Yet another LED package 30 that can be used with embodiments of the present invention is illustrated in FIGS. 3A and 3B. As shown therein, an LED package 30 includes one or more LED chips 32 mounted on a submount 34 to a carrier substrate 33. The carrier substrate 33 can include an alumina substrate and/or a metal core PCB carrier substrate. A reflector 44 attached to the carrier substrate 33 surrounds the LED chip 32 and defines an optical cavity 35 above the LED chip(s) 32. An encapsulant material 36, such as silicone, fills the optical cavity 35.

The reflector 44 reflects light emitted by the LED chip 32 away from the package 20. The reflector 44 also includes an upwardly extending cylindrical sidewall 45 that defines a channel in which a lens 50 can be inserted. The lens 50 is held in place by the encapsulant material, and can move lip and down as the encapsulant material 36 expands and contracts due to heat cycling. The encapsulant material 36 may further include a phosphor for wavelength conversion. The lens 50 may include a light-scattering lens that is configured to refract light emitted by the LED and the wavelength conversion material. In some embodiments, the light scattering lens is configured to scatter the emitted light randomly. The light-scattering can include a transparent lens body including light scattering particles such as $TiO_2$, $Al_2O_3$, $SiO_2$, etc in the lens body and/or the lens can include a roughened outer surface that can randomly scatter light that exits the lens 50.

Although it is possible to generate light that appears white through a combination of blue light emitted by an LED chip and yellow light emitted by a phosphor, objects illuminated by such light may not appear to have a natural coloring, because of the limited spectrum of the light. For example, because the light may have little energy in the red portion of the visible spectrum, red colors in an object may not be illuminated well by such light. As a result, the object may appear to have an unnatural coloring when viewed under such a light source.

The color rendering index (CRI) of a light source is an objective measure of the ability of the light generated by the source to accurately illuminate a broad range of colors. The color rendering index ranges from essentially zero for monochromatic sources to nearly 100 for incandescent sources. Light generated from a phosphor-based solid state light source may have a relatively low color rendering index.

For large-scale backlight and illumination applications, it is often desirable to provide a lighting source that generates a white light having a high color rendering index, so that objects and/or display screens illuminated by the lighting panel may appear more natural. Accordingly, such lighting sources may typically include an array of solid state lighting devices including red, green and blue light emitting devices. When red, green and blue light emitting devices are energized simultaneously, the resulting combined light may appear white, or nearly white, depending on the relative intensities of the red, green and blue sources. There are many different hues of light that may be considered "white." For example, some "white" light, such as light generated by sodium vapor lighting devices, may appear yellowish in color, while other "white" light, such as light generated by some fluorescent lighting devices, may appear more bluish in color.

The chromaticity of a particular light source may be referred to as the "color point" of the source. For a white light source, the chromaticity may be referred to as the "white point" of the source. The white point of a white light source may fall along a locus of chromaticity points corresponding to the color of light emitted by a black-body radiator heated to a given temperature. Accordingly, a white point may be identified by a correlated color temperature (CCT) of the light source, which is the temperature at which the heated black-body radiator matches the hue of the light source. White light typically has a CCT of between about 2500K and 8000K. White light with a CCT of 2500K has a reddish color, white light with a CCT of 4000K has a yellowish color, and while light with a CCT of 8000K is bluish in color.

"Warm white" refers to white light that has wavelength components in the red region of the spectrum. Warm white light typically requires a relatively high CRI, and accordingly can cause illuminated objects to have a more natural color.

For illumination applications, it is therefore desirable to provide a warm white light.

In order to achieve warm white emission, conventional packaged LEDs include either a single component orange phosphor in combination with a blue LED or a mixture of yellow/green and orange/red phosphors in combination with a blue LED. However, using a single component orange phosphor can result in a low CRI as a result of the absence of greenish and reddish hues. On the other hand, red phosphors are typically much less efficient than yellow phosphors. Therefore, the addition of red phosphor in yellow phosphor can reduce the effective efficiency of the package, which can result in poor luminous efficacy. Luminous efficiency is a measure of the proportion of the energy supplied to a lamp that is converted into light energy. It is calculated by dividing the lamp's luminous flux, measured in lumens, by the power consumption, measured in watts.

According to embodiments of the invention, a phosphor having a defined color point range can be used to generate white light along with a blue LED chip having a selected light emission property to produce a warm white LED having both high efficiency and a high color rendering index.

In particular embodiments, a yellow phosphor having a color point with a high ccx (x-coordinate) and low ccy (y-coordinate) is used. Such a phosphor can be used in combination with less red phosphor to obtain a warm white color emission. Furthermore, the LED chip used may have a shorter wavelength compared to blue LED chips conventionally used for white light conversion. For example, the LED chip may have a wavelength of about 450 nm. The lower wavelength chip may have a higher efficiency, which can increase the luminous efficacy of the package. However, the lower wavelength chip can reduce the CRI of the package. In order to compensate for the loss of CRI caused by using a lower wavelength chip, the LED is fabricated to have an electroluminescence characteristic with longer wavelength "shoulder." That is, even though the LED chip has a shorter peak wavelength, its light emission spectrum has additional optical energy at a longer wavelength than the peak wavelength compared to a conventional spectrum. The additional energy is attributable to a spike of optical energy at a longer wavelength than the peak wavelength. Although the spike of longer wavelength energy is lower than the energy at the peak wavelength, it can create a longer wavelength shoulder in the light emission spectrum of the LED chip. The presence of the longer wavelength shoulder in the light emission spectrum of the LED can make up for the lower peak wavelength of the LED chip.

A packaged LED according to embodiments of the invention can have a higher packaging factor, since the LED package can contain less red phosphor than a conventional warm white LED. "Packaging factor" is a figure of merit for packaged LEDs that refers to the white output of a packaged LED in lumens divided by the total power output of the LED chip alone.

Figure 4:
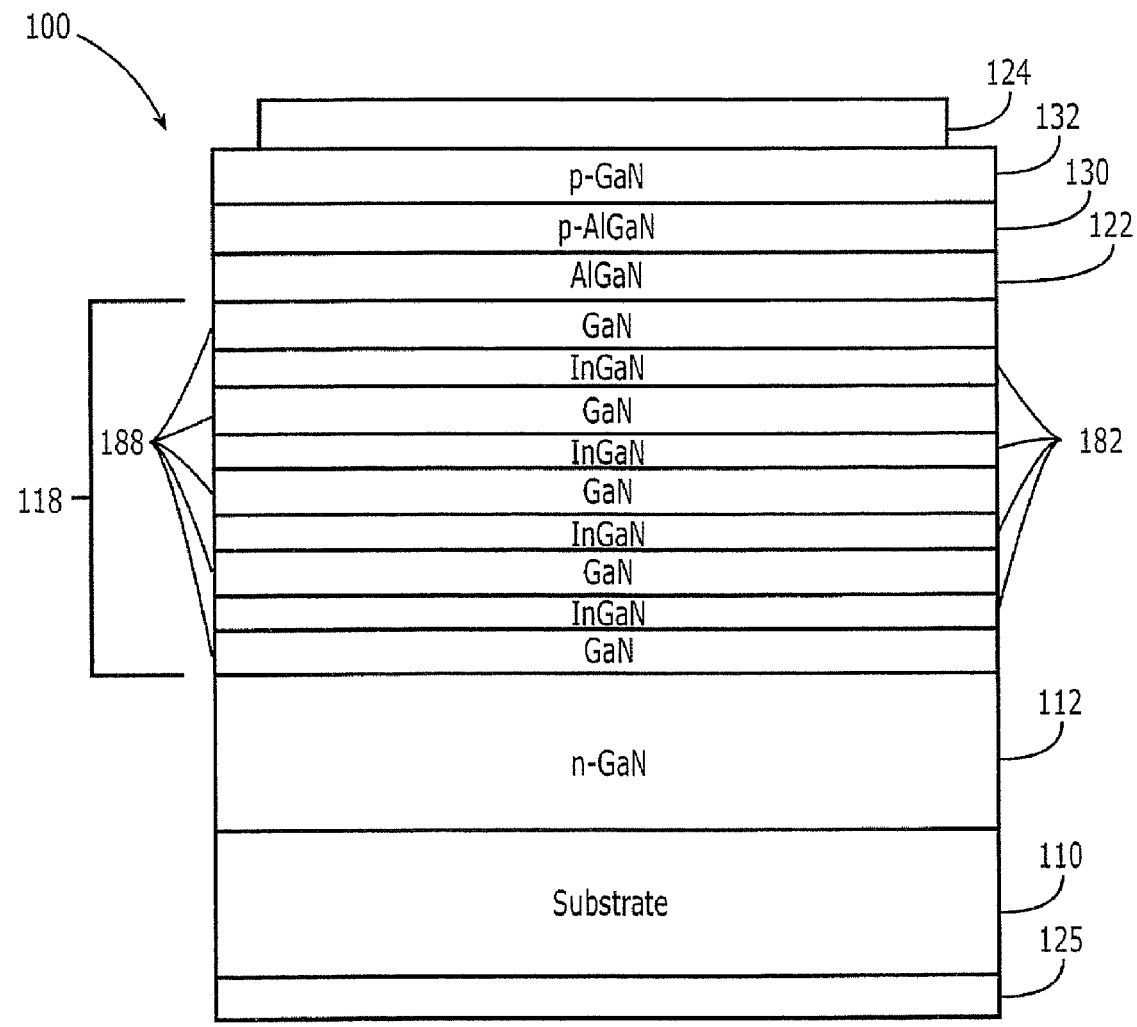
FIG. 4 illustrates a light emitting diode (LED) structure according to some embodiments of the invention.

An exemplary epitaxial structure of an LED chip that can be used to generate blue light having a light emission spectrum with a longer wavelength shoulder in accordance with embodiments of the invention is illustrated in FIG. 4. In particular, FIG. 4 illustrates a light emitting diode (LED) structure 100. The LED structure 100 of FIG. 4 is a layered semiconductor structure including gallium nitride-based semiconductor layers on a substrate 110. The substrate 110 is preferably 4H or 6H n-type silicon carbide, but can also include sapphire, silicon, bulk gallium nitride or another suitable substrate. In some embodiments, the substrate can be a growth substrate on which the epitaxial layers forming the LED structure 100 are formed. In other embodiments, the substrate 110 can be a carrier substrate to which the epitaxial layers are transferred. For example, the substrate 110 can include silicon, alumina, or any other suitable material that provides appropriate mechanical, electrical and/or optical properties. In some embodiments, the substrate can be removed altogether, as is known in the art.

As shown in FIG. 4, the LED structure 100 includes a silicon-doped GaN layer 112 on the substrate 110. One or more buffer layers (not shown) may be formed between the substrate 110 and the GaN layer 112. Examples of buffer layers between silicon carbide and group III-nitride materials are provided in U.S. Pat. Nos. 5,393,993 and 5,523,589, and U.S. application Ser. No. 09/154,363 entitled "Vertical Geometry InGaN Light Emitting Diode" assigned to the assignee of the present invention, the disclosures of which are incorporated by reference as if fully set forth herein. Similarly, embodiments of the present invention may also include structures such as those described in U.S. Pat. No. 6,201,262 entitled "Group III Nitride Photonic Devices on Silicon Carbide Substrates With Conductive Buffer Interlay Structure," the disclosure of which is incorporated herein by reference as if set forth fully herein.

An n-type superlattice structure (not shown), can be formed on the GaN layer 112. Suitable n-type superlattice structures are described, for example, in U.S. Pat. No. 6,958,497, assigned to the assignee of the present invention, the disclosure of which is incorporated herein by reference in its entirety. The active region 118 can include a multi-quantum well structure, as discussed in more detail below. An undoped GaN and/or AlGaN layer 122 is on the active region 118, and an AlGaN layer 130 doped with a p-type impurity is on the undoped layer 122. A GaN contact layer 32, also doped with a p-type impurity, is on the AlGaN layer 130. The structure further includes an n-type ohmic contact 125 on the substrate 110 and a p-type ohmic contact 124 on the contact layer 132.

The GaN layer 112 can be between about 500 and 4000 nm thick inclusive and is most preferably about 1500 nm thick. The GaN layer 112 may be doped with silicon at a level of about 5E17 to 5E18 cm$^{-3}$. A second GaN layer (not shown) having a thickness of about 80 Å and being doped with silicon at a level of less than about 5E19 cm$^{-3}$ can be formed on the GaN layer 112.

The active region 118 may comprise a multi-quantum well structure that includes multiple InGaN quantum well layers 182 separated by barrier layers 188.

The undoped layer 122 on the active region 118 can be undoped GaN or AlGaN between about 0 and 120 Å thick inclusive. As used herein, "undoped" refers to material that is not intentionally doped with a dopant ion either duing growth or afterwards, such as by ion implantation or diffusion. The undoped layer 122 can be about 35 Å thick. If the undoped layer 122 comprises AlGaN, the aluminum percentage in such layer can be about 10-30% and in some embodiments can be about 24%. The level of aluminum in the undoped layer 122 may also be graded in a stepwise or continuously decreasing fashion. The undoped layer 122 may be grown at a higher temperature than the growth temperatures in quantum well region 118 in order to improve the crystal quality of the undoped layer 122. Additional layers of undoped GaN or AlGaN may be included in the vicinity of the undoped layer 122. For example, the LED structure 100 may include an additional layer of undoped AlGaN about 6-9 Å thick between the active region 118 and the undoped layer 122.

An AlGaN layer 130 doped with a p-type impurity such as magnesium is provided on the undoped layer 122. The AlGaN layer 130 may be between about 0 and 300 Å thick inclusive and, more particularly, about 130 Å thick. A contact layer 132 of p-type GaN is provided on the layer 130 and is preferably about 1800 Å thick. Ohmic contacts 124 and 125 are provided on the p-GaN contact layer 132 and the substrate 110, respectively.

The active region 118 comprises a multi-quantum well structure that includes multiple InGaN quantum well layers 182 separated by barrier layers 188. The barrier layers 188 can include $In_xGa_{1-x}N$ where $0 \leq x < 1$. The indium composition of the barrier layers 188 can be less than that of the quantum well layers 182, so that the barrier layers 188 have a higher bandgap than quantum well layers 182. The barrier layers 188 and quantum well layers 182 may be undoped (i.e. not intentionally doped with an impurity atom such as silicon or magnesium).

In further embodiments of the present invention, the barrier layers 188 comprise $Al_xIn_yGa_{1-x-y}N$ where $0 < x < 1$, $0 \leq y < 1$ and $x+y \leq 1$. By including aluminum in the crystal of the barrier layers 188, the barrier layers 188 may be lattice-matched to the quantum well layers 182, thereby providing improved crystalline quality in the quantum well layers 182, which can increase the luminescent efficiency of the device.

The structure of the active layer 118 including quantum well layers 182 and the barrier layers 188 can be as described, for example, in U.S. Pat. No. 6,958,497.

The wavelength of light output by the LED structure 100 can be affected by many different growth parameters of the active region 118, including the thickness, composition and growth temperature of the quantum well layers 182. In particular, the indium composition of the quantum well layers 182 has a strong influence on the wavelength of light output by the structure. The more indium that is included in a quantum well 182, the longer the wavelength of light that will be produced by the well. For example, an indium concentration of about 10 to 27% may produce blue light, while an indium concentration of 28 to 35% may produce green light.

As described above, in some embodiments, the LED chip may have a light emission spectrum that includes a peak wavelength at 450 nm with a shoulder located at a slightly longer wavelength, such as at about 465-480 nm. The peak wavelength of 450 nm can be provided through an appropriate selection of indium concentration and growth conditions for the majority of the quantum well layers 182 of the device 100. The exact growth conditions and indium concentrations depend on the growth system and source materials used. The tuning of a system to produce an LED structure that generates a particular wavelength of light is well known in the art. The longer wavelength shoulder can be provided by altering the indium concentration and/or growth conditions and/or the thickness of one or more of the quantum wells 182 to provide a longer wavelength emission in addition to the peak wavelength emission. For example, the indium concentration of one or more of the quantum wells 182 can be increased. In this manner, although the majority of quantum wells 182 can be formed to generate the peak wavelength (e.g. 450 nm), one or more of the quantum wells can be formed to generate a longer wavelength, resulting in the overall chip having a light emission spectrum that desirably includes a longer wavelength shoulder.

Figure 5A:
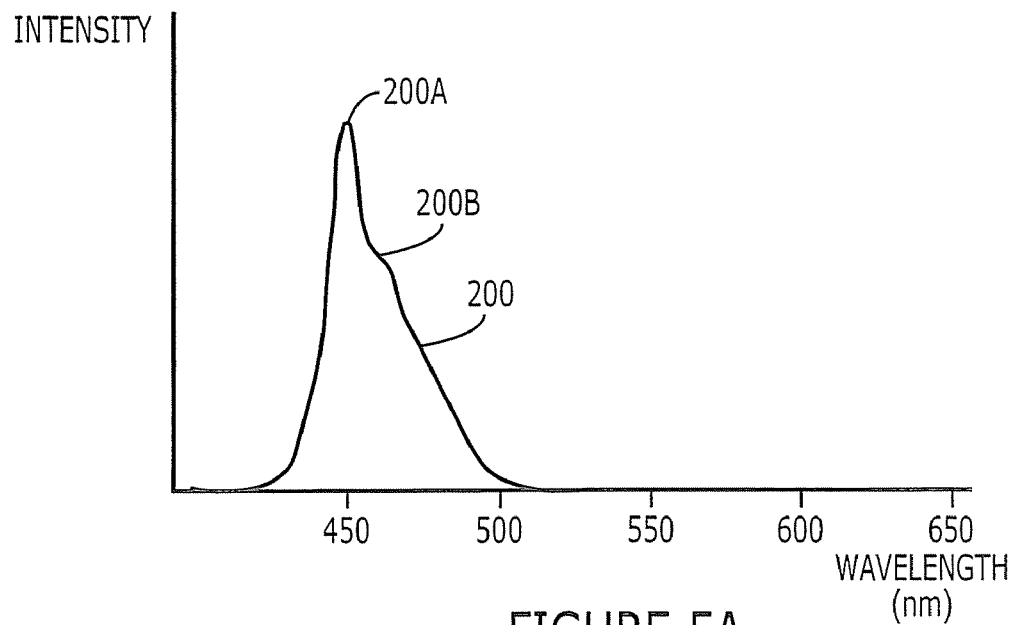
FIG. 5A is a graph of a representative light emission spectrum of an unpackaged LED according to some embodiments of the invention.

FIG. 5A is a graph of a representative light emission spectrum 200 of an unpackaged LED according to some embodiments of the invention. That is, the light emission spectrum 200 shows the output of primary light by an LED chip. As shown in FIG. 5A, the light emission spectrum 200 of the LED includes a peak 200A, which can be located, for example, from about 450 nm to about 460 nm. The light emission spectrum 200 also includes a longer wavelength shoulder 200B located at a wavelength that is longer than the peak wavelength 200A. For example, the longer wavelength shoulder can be located at about 25-30 nm greater than the peak wavelength, or at about 465-480 nm. The light emission spectrum 200 is plotted as intensity versus wavelength. The intensity of the light emission spectrum is shown in arbitrary units.

Figure 5B:
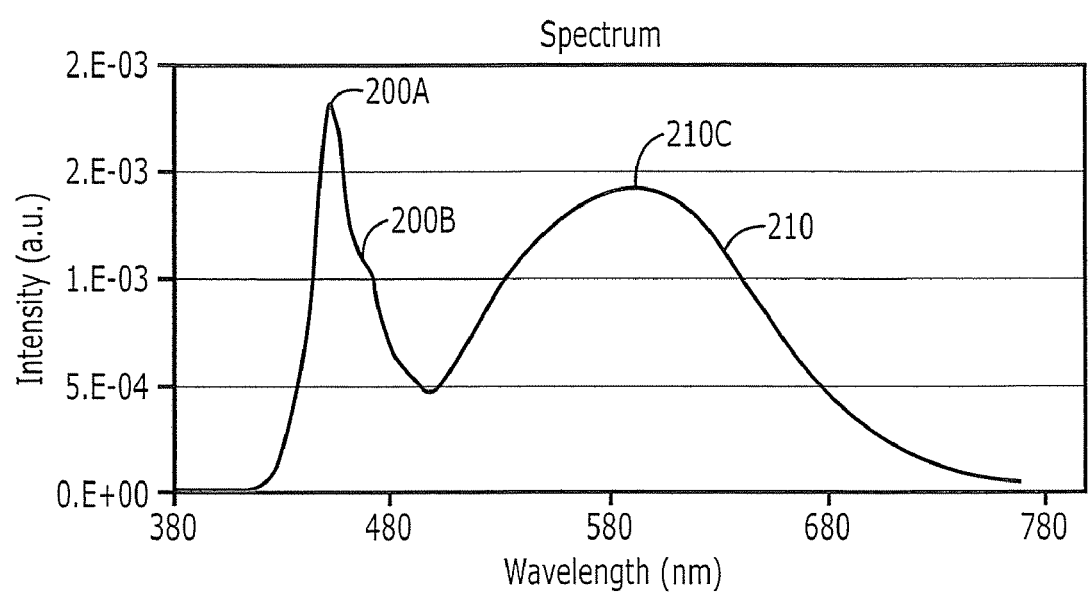
FIG. 5B is a graph of a representative light emission spectrum of a packaged LED according to some embodiments of the invention.

FIG. 5B is a graph of a representative light emission spectrum 210 of a packaged LED according to some embodiments of the invention. In the light emission spectrum 210, some of the primary light emitted by the LED chip is absorbed by phosphors and is re-emitted as secondary light. Some of the primary light is not absorbed by the phosphor, resulting in the blue emission peak corresponding to the peak wavelength 200A and shoulder 200B of the primary light still being visible in the spectrum 210. However, the spectrum 210 also includes a secondary light peak 210C of longer wavelength light emitted by the phosphor.

As can be seen in FIG. 5B, a packaged LED according to some embodiments can include a light emitting diode configured to emit primary light having a peak wavelength that is less than about 460 nm and having a shoulder emission component at a wavelength that is greater than the peak wavelength. The wavelength conversion material of the package receives the primary light emitted by the light emitting diode and responsively emits light having a color point with a ccx greater than about 0.4 and a ccy less than about 0.45, where ccx and ccy refer to the x- and y- color points of the light as plotted on a 1931 CIE color diagram. In particular, the wavelength conversion material may be configured emit light having a color point with a ccx between about 0.40 and 0.46 and a ccy between about 0.36 and 0.42 in response to the primary light. The LED can have a peak wavelength that is less than about 460 nm. In particular, the LED may have a peak wavelength of about 450 nm. The LED may have a shoulder emission component at about 465-480 nm.

The wavelength conversion material may have a D50 particle size of about 11 µm or greater, which can reduce scattering within the wavelength conversion material.

A second wavelength conversion material can be provided in the device, wherein the second wavelength conversion material is configured to emit light having a dominant wavelength greater than 600 nm, i.e., in the red portion of the visible spectrum. In some embodiments, the second wavelength conversion material can have ccx=0.639 and ccy=0.362. The second wavelength conversion material may include an orange or a red phosphor. In some embodiments, a ratio of a total amount of the first and second wavelength conversion materials by weight can be about 70:30, which can be significantly more than conventionally required.

Figure 6:
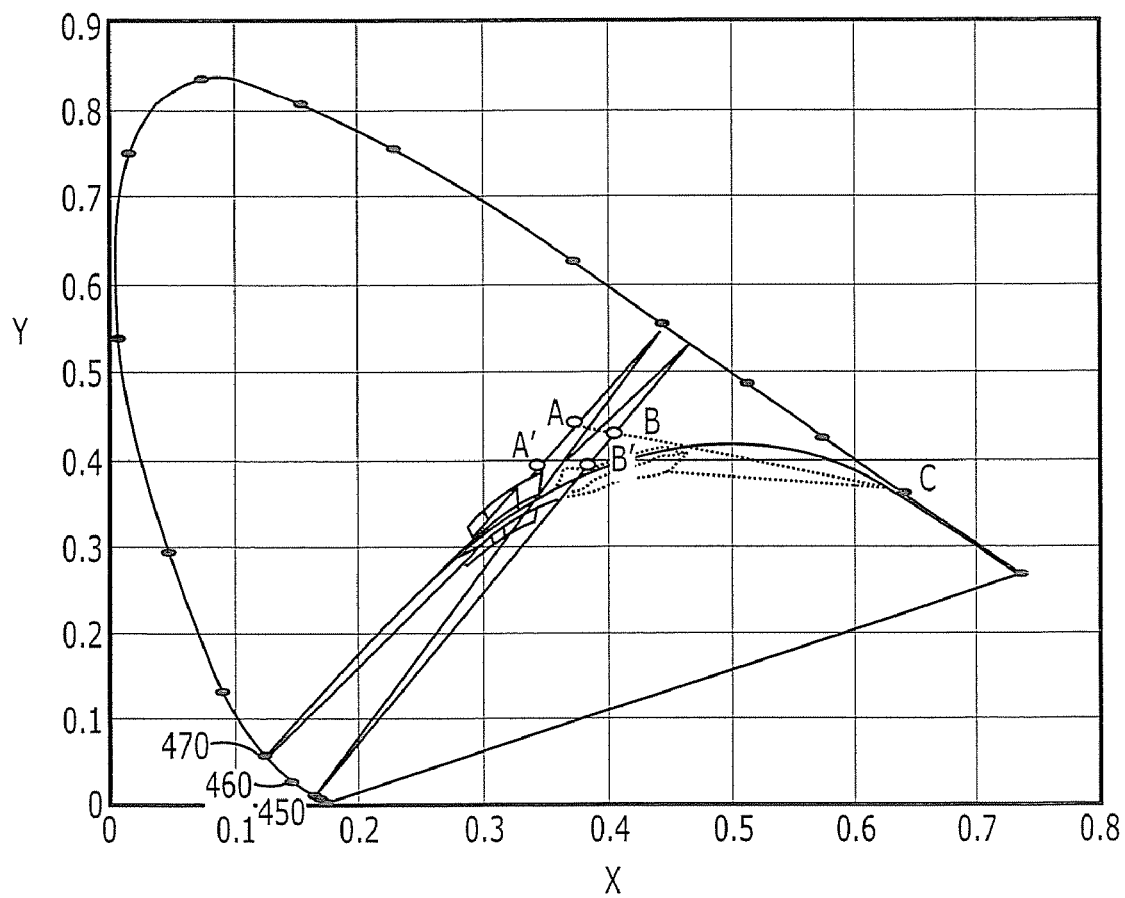
FIG. 6 is a 1931 CIE diagram showing the dominant emission color points of various types of phosphors including phosphors that can be used in packaged LEDs according to some embodiments of the invention.

FIG. 6 is a 1931 CIE diagram showing the dominant emission color points of a cooler white (points A and A'), warmer white (points B and B'), and the red phosphor. Points A and A' correspond to an emitter wavelength of about 470 nm, while points B and B' correspond to an emitter wavelength of about 450 nm. By using a yellow phosphor (e.g., YAG) with a relatively high ccx and a relatively low ccy, the output of the packaged LED can exhibit a natural shift towards warmer white (point B). Furthermore, this may require less red phosphor to provide warmer white light (or to reach the desired color point which is shown by the 2800K CCT marker), potentially resulting in higher efficiency and/or better reliability and/or lower cost because the red phosphors are significantly more expensive than the yellow phosphors. Using a softer or more conventional YAG with a lower ccx and higher ccy, the output of the packaged LED will result in a cooler white color point (shown by point A). This would require more red phosphor to provide warmer white light. This would result in lower efficiency and/or poor reliability and/or higher cost.

Using phosphors with larger particle sizes may further improve efficiency due to reduced scattering in the phosphor layer. As light scattering may be desirable for uniformity, light scattering may be obtained using a textured lens in the package. The large phosphor particles often results in clustering and results in achieving localized randomization of color temperature, thereby resulting in an overall uniform spatial color temperature profile. Suitable phosphors are available, for example, from Philips, MCC Group, Leuchtstoffwerk Breitungen, Phosphor Tech, Litec, and/or Sarnoff.

In some embodiments, it may be useful to use a yellow phosphor with a relatively large phosphor size. In particular, the yellow phosphor may have a D50 size of about 11.6 μm, which is about the same size as typical red phosphors. (A D50 size of 11.6 μm means that 50% of the phosphor particles are smaller than 11.6 μm.)

By using a yellow phosphor with a relatively high ccx and a relatively low ccy, the output of the packaged LED can exhibit a natural shift towards warmer white. Furthermore, this may require less red phosphor to provide warmer white light, potentially resulting in higher efficiency and/or better reliability. Using phosphors with larger particle sizes may further improve efficiency due to reduced scattering in the phosphor layer. As light scattering may be desirable for uniformity, light scattering may be obtained using a textured lens in the package.

To achieve a color point close to 2800K on the black-body curve, the ratio of the weight of the red phosphor to the weight of the warmer YAG may be about 1:2.3. Therefore, the percentage of red phosphor in the mixture is about 30%. However, in order to reach the same color point using the cooler YAG, the ratio of the weight of the same red phosphor to the cooler YAG is about 1:1.9. Thus, the percentage of red phosphor in the mixture is about 34.5%. The thicknesses of the wavelength conversion layer used for the warmer and the cooler YAG may be about 45 mm and 46 mm, respectively. Having a lower amount of red phosphor may result in higher effective efficacy, better reliability under high temperature and humidity operation, and lower cost. Experimentally obtained data shows that the efficiency boost is about 7%. The cost benefit based on the consumed material is about 12%.

The difference of the percentage of red phosphor used increases as the final color point moves from warm-white to soft-white (or neutral white). Therefore, the softer white color points on the line joining A', B' and the red phosphor color point, may have significantly higher efficiency when using a warmer phosphor, compared to a cooler phosphor.

Figure 7:
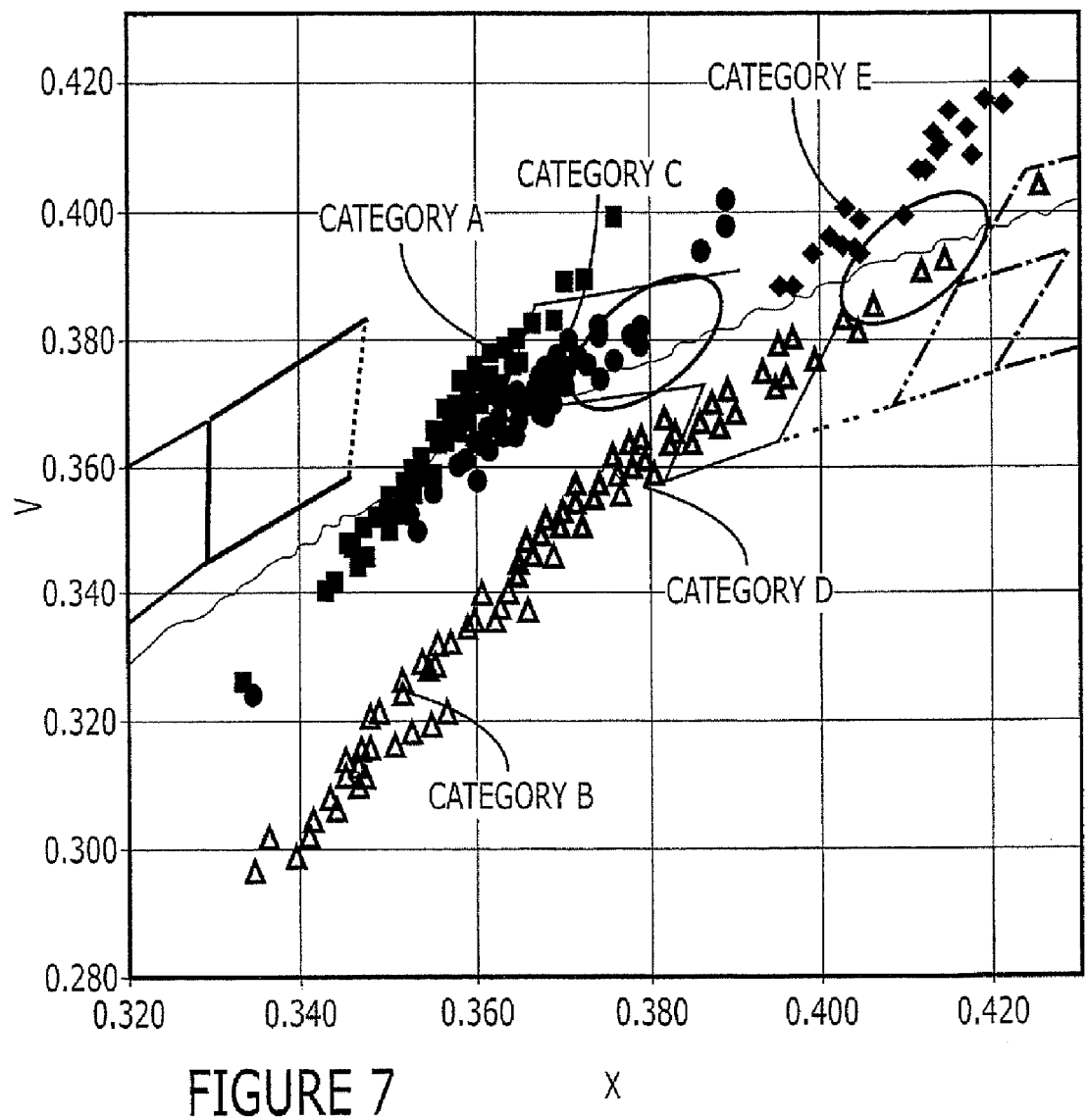
FIG. 7 illustrates the color points of packaged LEDs according to some embodiments of the invention within a portion of the 1931 CIE diagram, wherein $0.32 \leqq ccx \leqq 0.425$ and $0.28 \leqq ccy \leqq 0.425$.

FIG. 7 illustrates a portion of the 1931 CIE diagram, wherein 0.32≦ccx≦0.425 and 0.28≦ccy≦0.425. The portion of the CIE diagram illustrated includes the blackbody radiation curve, and covers regions of the color space that are generally perceived as white. Various sub-regions are defined within the color space, and are used as binning targets during manufacturing. Accordingly, some of the regions are designated as the TA, TB, TE, regions, etc. White emitters can be categorized, or binned, according to the region in which their emitted light falls.

The color point of emitted light is plotted in FIG. 7 for a number of emitters packaged according to embodiments of the invention. In particular, emitters were fabricated in five categories, as shown in Table 1.

TABLE 1

| | | Build Parameters | | | |
|---|---|---|---|---|---|
| Category | Peak wavelength | Yellow Phosphor | Red Phosphor | % of red phosphor | Dep. Time |
| A | 447-454 (450 nm with shoulder) | 16 g | 0 g | 0 | 400 s |
| B | 447-454 (450 nm with shoulder) | 16 g | 1 g | 5.9 | 330 s |
| C | 460-464 (460 nm) | 16 g | 1 g | 5.9 | 330 s |
| D | 455-459 (457 nm) | 16 g | 2.75 g | 14.7 | 300 s |
| E | 459-463 (460 nm) | 16 g | 2.75 g | 14.7 | 300 s |

Accordingly, Category A emitters were fabricated using LED chips as primary emitters having a peak emission wavelength of 450 nm and encapsulated with 16 g of yellow phosphor having ccx≈0.46 and ccy≈0.526. Category B emitters were fabricated using LED chips as primary emitters having a peak emission wavelength of 450 nm and encapsulated with a phosphor mixture including 16 g of yellow phosphor and 1 gram of red phosphor having ccx≈0.639 and ccy≈0.362, which constituted 5.9% of the total phosphor by weight. Category C emitters were fabricated using LED chips as primary emitters having a peak emission wavelength of 460 nm and encapsulated with a phosphor mixture including 16 g of yellow phosphor and 1 gram of red phosphor, which constituted 5.9% of the total phosphor by weight. Category D emitters were fabricated using LED chips as primary emitters having a peak emission wavelength of 457 nm and encapsulated with a phosphor mixture including 16 g of yellow phosphor and 2.75 grams of red phosphor, which constituted 14.7% of the total phosphor by weight. Category E emitters were fabricated using LED chips as primary emitters having a peak emission wavelength of 460 nm and encapsulated with a phosphor mixture including 16 g of yellow phosphor and 2.75 grams of red phosphor, which constituted 14.7% of the total phosphor by weight.

The LED chips were fabricated by spincoating or dispensing LED wafers with phosphors. The LEDs were packaged in Cree XRE packages including amodel reflectors and scattering lenses.

For comparison, conventional soft-white and warm-white emitters typically include more than 25% red phosphor by weight. For example, typical soft-white emitters typically have about 25-35% red phosphor by weight, while warm-white emitters typically have about 35-45% of red phosphor by weight.

As seen in FIG. 7, the Category A emitters displayed color points that fell near the blackbody radiation curve. The Category B emitters displayed color points that fell below the blackbody radiation curve on average. The Category C emitters displayed color points that fell around the blackbody radiation curve and that were slightly warmer than the Category A. The Category D emitters displayed color points that were slightly below the blackbody radiation curve on average, but warmer than the Category C emitters. The Category E emitters displayed color points that were slightly above the blackbody radiation curve on average and still warmer than the Category D emitters.

Figure 8:
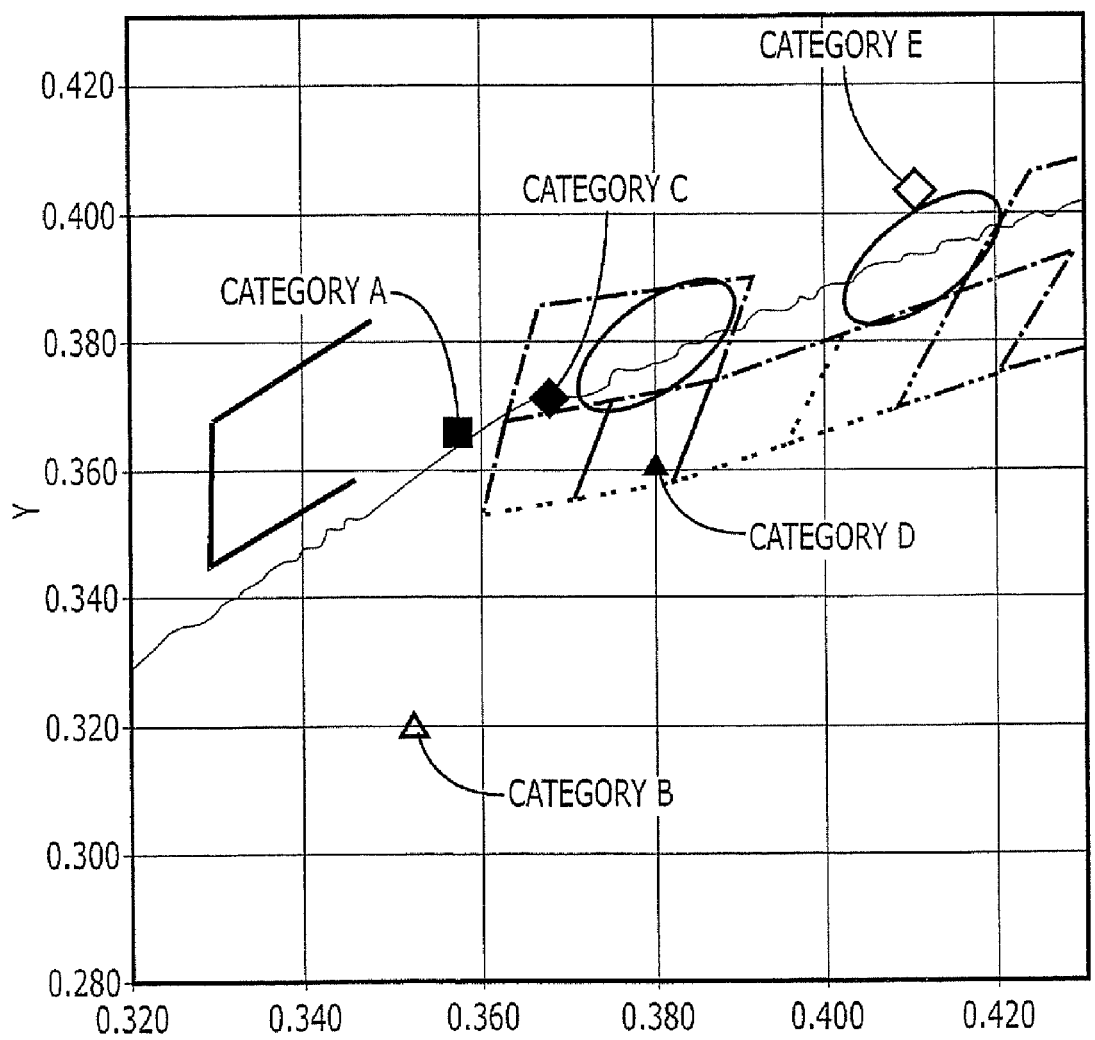
FIG. 8 illustrates average color points of packaged LEDs according to some embodiments of the invention within a portion of the 1931 CIE diagram, wherein $0.32 \leqq ccx \leqq 0.425$ and $0.28 \leqq ccy \leqq 0.425$.

The average color points of the emitters are plotted on FIG. 8. The packaging factor, color rendering index, and lumens/ltW for the various categories are shown in the Table 2.

TABLE 2

Light Emission Characteristics

| Category | Packaging Factor | Lum/ltW | CRI |
|---|---|---|---|
| A | 0.256 | 336 | 68 |
| B | 0.231 | 299 | 59 |
| C | 0.241 | 324 | 80 |
| D | 0.225 | 316 | 72 |
| E | 0.214 | 337 | 79 |

By comparison, conventional warm white emitters may have packaging factors less than 0.2.

Figure 9A:
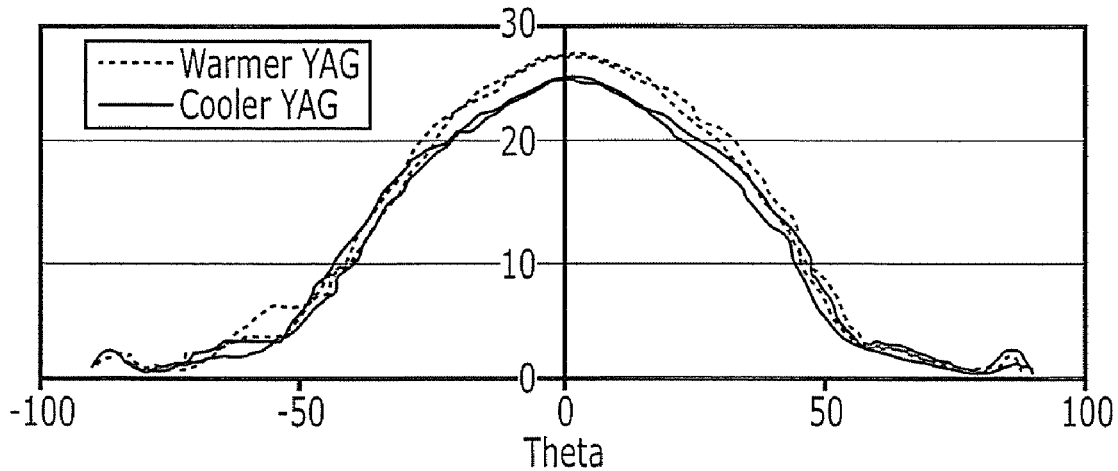
FIGS. 9A-9B illustrate far-field data for emitters according to embodiments of the invention.
Figure 9B:
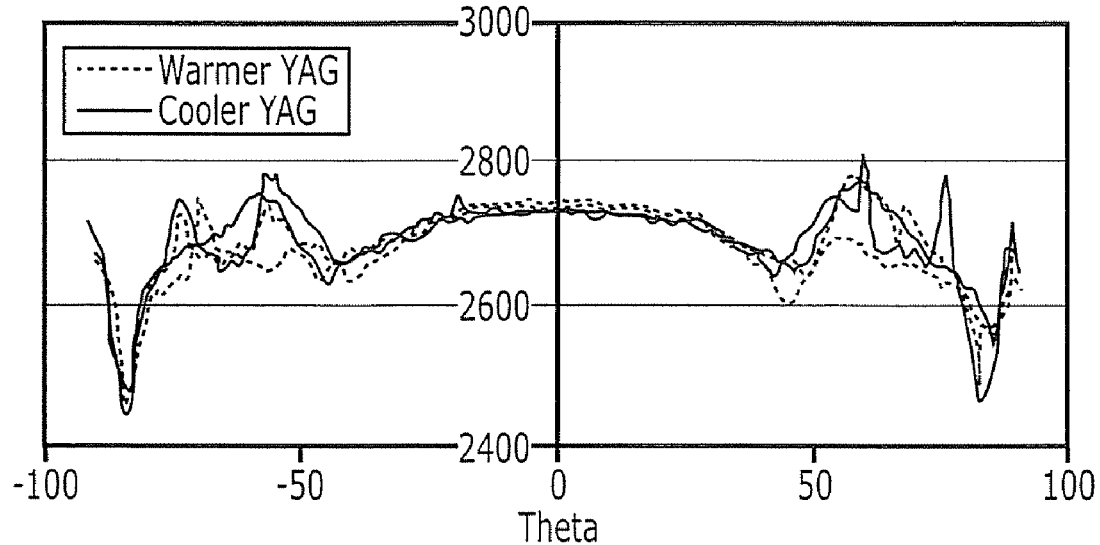

FIGS. 9A-9B illustrate far-field data for emitters at comparable color points according to embodiments of the invention. In each figure, comparison of the curves are shown for cooler and warmer YAG:Ce phosphor. Average properties of devices with cooler and warmer YAG:Ce phosphor at 350 mA are shown in Table 3. For the devices shown in Table 3, the warmer YAG:Ce phosphor devices had a ratio of yellow to red phosphor of 2.3:1, while the cooler YAG:Ce phosphor devices had a ratio of yellow to red phosphor of 1.9:1.

TABLE 3

Light Emission Characteristics

| Type | LumFlux | Lum/W | Lum/ltW | ccx | ccy | CCT | Vf |
|---|---|---|---|---|---|---|---|
| Warm YAG | 68.0 | 58.9 | 311.2 | 0.4554 | 0.4109 | 2767 | 3.296 |
| Cool YAG | 63.8 | 55.6 | 312.3 | 0.4549 | 0.4134 | 2792 | 3.278 |

FIG. 9A illustrates the comparison of the luminous intensity. It is evident that the maximum luminous intensity of the warmer YAG is higher than that of the cooler YAG. However, there is no significant difference in the emission angle (or full-width-at-half-maximum) for the two YAGs. FIG. 9B illustrates the comparison of the CCT profile. No significant difference in the color temperature range was observed between the cooler and the warmer YAG.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A packaged light emitting device (LED), comprising:
    a light emitting diode configured to emit primary light having a peak wavelength that is less than about 465 nm and having a shoulder emission component at a wavelength that is greater than the peak wavelength wherein the shoulder emission component comprises a spike of optical energy at a longer wavelength than the peak wavelength; and
    a wavelength conversion material configured to receive the primary light emitted by the light emitting diode and to responsively emit light having a color point with a ccx greater than about 0.4 and a ccy less than about 0.55, wherein (ccx, ccy) represents the coordinates of the color point on a 1931 CIE color diagram.

2. The packaged LED of claim 1, wherein the wavelength conversion material is a YAG:Ce.

3. The packaged LED of claim 1, wherein the wavelength conversion material is configured to emit light having a saturated color point with a ccx between about 0.458 and 0.463 and a ccy between about 0.524 and 0.528 in response to the primary light.

4. The packaged LED of claim 1, wherein the wavelength conversion material has a particle size distribution such that a D50 particle size of the wavelength conversion material is about 11 μm or greater.

5. The packaged LED of claim 1, wherein the wavelength conversion material comprises a first wavelength conversion material, the device further comprising a second wavelength conversion material configured to receive light emitted by the light emitting diode and to responsively emit light having a dominant wavelength greater than 600 nm.

6. The packaged LED of claim 5, wherein the second wavelength conversion material particle size distribution such that a D50 particle size of the wavelength conversion material is about 10 μm or greater.

7. The packaged LED of claim 5, wherein a percentage of a total amount of the first and second wavelength conversion materials by weight represented by the second wavelength conversion material can be about 5% to about 40%.

8. The packaged LED of claim 1, further comprising a light-scattering lens arranged over the wavelength conversion material and configured to refract light emitted by the LED and the wavelength conversion material, wherein the light scattering lens is configured to scatter the emitted light randomly.

9. The packaged LED of claim 8, wherein the light-scattering lens comprises a transparent lens body including light scattering particles in the lens body.

10. The packaged LED of claim 8, wherein the light-scattering lens comprises a roughened outer surface.

11. The packaged LED of claim 1, wherein the LED has a peak wavelength that is less than about 460 nm.

12. The packaged LED of claim 11, wherein the LED has a peak wavelength of about 450 nm.

13. The packaged LED of claim 11, wherein the LED has a dominant wavelength below 480 nm.

14. The packaged LED of claim 11, wherein the LED has a shoulder emission component between 465 and 480 nm.

15. The packaged LED of claim 11, wherein the LED has a shoulder emission component at about 470 nm.

16. A packaged light emitting device (LED), comprising:
    a light emitting diode configured to emit primary light having a peak wavelength that is less than about 465 nm and having a shoulder emission component at a wavelength that is greater than the peak wavelength wherein the shoulder emission component comprises a spike of optical energy at a longer wavelength than the peak wavelength; and
    a wavelength conversion material configured to receive light emitted by the light emitting diode and to responsively emit light having a saturated color point with a ccx between about 0.458 and 0.463 and a ccy between about 0.524 and 0.528, wherein (ccx, ccy) represents the coordinates of the color point on a 1931 CIE color diagram.

17. A method of forming a packaged light emitting device (LED), comprising
- mounting a light emitting diode on a submount, the light emitting diode being configured to emit primary light having a peak wavelength that is less than about 465 nm and having a shoulder emission component at a wavelength that is greater than the peak wavelength wherein the shoulder emission component comprises a spike of optical energy at a longer wavelength than the peak wavelength; and
- positioning a wavelength conversion material adjacent the light emitting diode, wherein the wavelength conversion material is configured to receive the primary light emitted by the light emitting diode and to responsively emit light having a color point with a ccx greater than about 0.4 and a ccy less than about 0.6, wherein (ccx, ccy) represents the coordinates of the color point on a 1931 CIE color diagram.

18. The method of claim 17, wherein the wavelength conversion material is configured emit light having a saturated color point with a ccx between about 0.458 and 0.463 and a ccy between about 0.524 and 0.528 in response to the primary light.

19. The method of claim 17, wherein the wavelength conversion material has a particle size distribution such that a D50 particle size of the wavelength conversion material is about 11 μm or greater.

20. The method of claim 17, wherein the wavelength conversion material comprises a first wavelength conversion material, the method further providing a second wavelength conversion material configured to receive light emitted by the light emitting diode and to responsively emit light having a dominant wavelength greater than 600 nm.

21. The method of claim 20, wherein a percentage of a total amount of the first and second wavelength conversion materials by weight represented by the second wavelength conversion material can be about 5% to about 40%.

22. The method of claim 17, further comprising mounting a light-scattering lens over the wavelength conversion material, wherein the light-scattering lens is configured to scatter primary light emitted by the LED and secondary light emitted by the wavelength conversion material.

* * * * *